United States Patent [19]

Gupta

[11] 4,235,283

[45] Nov. 25, 1980

[54] MULTI-STUD THERMAL CONDUCTION MODULE

[75] Inventor: Omkarnath R. Gupta, Boca Raton, Fla.

[73] Assignee: International Business Machines Corporation, Armonk, N.Y.

[21] Appl. No.: 104,635

[22] Filed: Dec. 17, 1979

[51] Int. Cl.³ .......................................... H01L 23/42
[52] U.S. Cl. .................................. 165/80 C; 165/185; 357/81; 361/386
[58] Field of Search .................. 165/80 B, 80 C, 185; 357/81, 82; 361/386

[56] References Cited

U.S. PATENT DOCUMENTS

| | | | |
|---|---|---|---|
| 3,744,560 | 7/1973 | Sell, Jr. | 165/185 |
| 3,993,123 | 11/1976 | Chu et al. | 165/80 C |
| 4,156,458 | 5/1979 | Chu et al. | 165/185 X |
| 4,184,539 | 1/1980 | Rein | 165/80 B |
| 4,193,445 | 3/1980 | Chu et al. | 165/185 X |

OTHER PUBLICATIONS

Chip Cooling, Krumm, IBM Tech. Disc. Bull., vol. 20, No. 7, Dec. 1977, pp. 2728-2729.
Articulated Thermal Conductor For Semiconductor Chip Packages, Gregor et al., IBM Tech. Disc. Bull., vol. 20, No. 8, Jan. 1978, pp. 3131-3132.
Conduction Cooling, Chu, IBM Tech. Disc. Bull., vol. 21, No. 2, Jul. 1978, pp. 751, 752-753.

Primary Examiner—Sheldon Richter
Attorney, Agent, or Firm—Douglas R. McKechnie

[57] ABSTRACT

The thermal conduction module for removing heat from one or more chips located therein consists of a housing made of heat conductive materials forming a cap over the chips. The housing contains one or more openings, one opposite each of the chips. More than one heat conductive element is included in each of the openings and are free to move lengthwise within the opening. The heat conductive elements are spring loaded so that the end of each element contacts the associated chip thereby lowering the thermal resistance of the interface therebetween. Side spring means are located between the sides of adjacent heat conductive elements forcing them away from one another and into contact with the opening wall.

9 Claims, 9 Drawing Figures

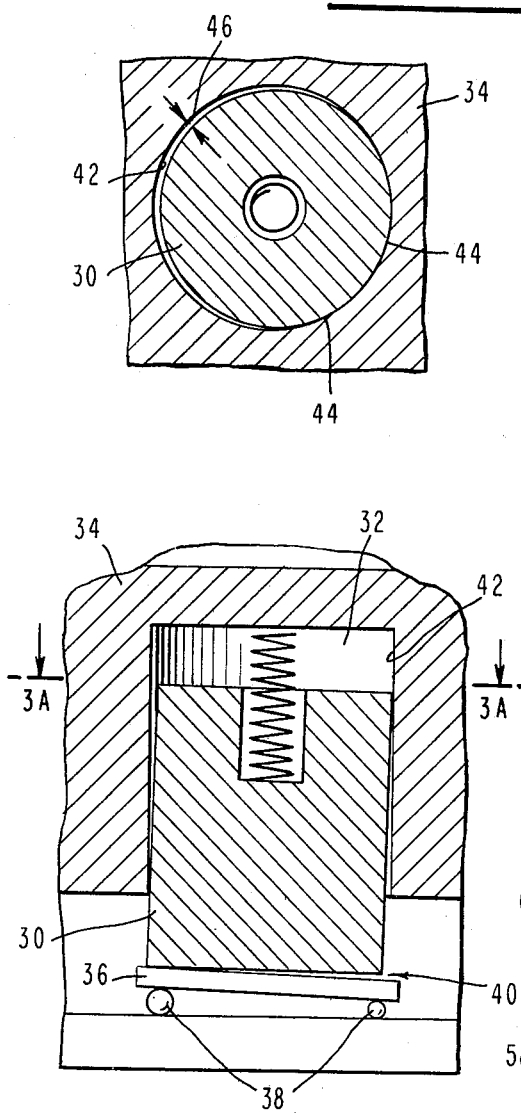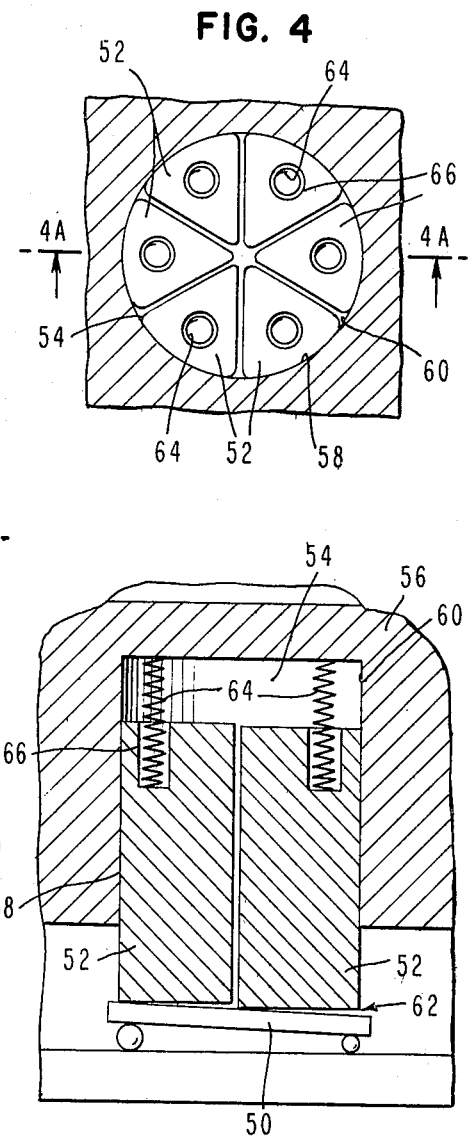

MULTI-STUD THERMAL CONDUCTION MODULE

DESCRIPTION

1. Technical Field

This invention relates to a thermal conduction assembly or module for integrated circuit chips and, more particularly, to a thermal conduction module in which the heat transfer path from the chips to a heat sink is improved.

In connection with integrated circuit chip thermal conduction modules, it is necessary to remove the heat generated by the circuitry on the chips to a heat sink, such as a cold plate which has cooling fluid continually circulating therethrough. Improving the heat conduction path from the chip to the heat sink not only allows a higher power chip to be utilized, but alternatively allows a simpler heat sink to be used. For example, a heat sink comprising heat dissipating fins located in a forced air stream can be used to replace the more complicated cold plate.

2. Background Art

With the miniaturized capabilities afforded by the discovery of solid state electronics, various improved means of dissipating the heat generated by solid state components has been investigated. The standard for forced convection means appears to have reached its limit of practicality in that the amount of air that is required to provide sufficient cooling to the limited heat dissipating surfaces introduces a noise problem, and without some auxiliary technique cannot maintain each of a large number of components within its critical, narrow operating temperature range. Accordingly, especially in connection with large scale computer systems, various innovative cooling systems have been devised. One of the more recent systems investigated has been the gas encapsulated cooling module of U.S. Pat. No. 3,993,123, issued Nov. 23, 1976, wherein an encapsulated cooling unit or module is provided which utilizes inert gas having good thermal conductivity as the encapsulated medium in combination with a conductive heat transfer arrangement. The integrated circuit chips to be cooled in the system are reverse mounted by connecting them face down to a substrate through solder balls. Because of this type of mounting, the chip is often slightly tilted. The tilt results in a poor surface contact between the conductive stud element and the back side of the chip. Accordingly, a high thermal resistance joint is formed which, in the case of the patent, required the insertion of a thermal conductive gas to lower the resistance.

U.S. Pat. No. 4,156,458, issued May 29, 1979, sets forth a heat conductive metal foil bundle of sufficient thickness to contact sufficient surface area of the exposed back side of the chip to provide the required heat transfer, and which is sufficiently thin to be flexible enough to absorb differences in distance between the chip and the heat sink due to tilt as well as to expand and contract due to temperature changes, and which is of sufficient length to connect to the heat sink at or near the other end thereof. Good heat transfer was obtained using this arrangement, however, the large thickness of the bundle often adversely affected the flexibility and, therefore, exceeded the surface force limits established by the solder ball mountings.

U.S. patent application Ser. No. 047,513, filed June 11, 1979, sets forth an improvement of the heat transfer between an integrated circuit chip and a heat sink by utilizing a matrix of pins mounted in a matrix of cylindrical openings in the housing adjacent the chips to be cooled. The pins have headers on the outer end thereof which contact the chip surface. Each pin is spring loaded individually to make individual contact with the chip surface with the required force. It should be appreciated, that each pin makes individual contact with the chip surface under individual spring loading so as to make contact regardless of the chip tilt.

DISCLOSURE OF THE INVENTION

In accordance with the present invention, improved heat transfer from one or more chips located in a heat conductive module is provided. The apparatus includes a housing made of a heat conductive material which forms a cap over the chip. One or more cylindrical openings are provided in the housing, one opposite each of the chips. More than one heat conductive element or stud is located in each of the openings, each of which is free to move independently. End spring means are located in the inner end of each opening for applying longitudinal force to each of the studs so that the end of the stud opposite the spring contacts the adjacent chip, thereby lowering the thermal resistance between the chip and the studs. Side spring means are located between the sides of adjacent studs forcing them away from one another and into contact with the opening walls to thereby lower the thermal resistance between the studs and the opening walls. It should be appreciated, that each stud makes individual contact with the chip surface and with the cylindrical opening wall under individual spring loading so as to make contact regardless of the chip tilt.

The main advantage of the heat conduction module of the present invention is that the thermal conduction from the integrated circuit chips within the module is improved regardless of the chip tilt.

Another advantage of the heat conduction module of the present invention is that the thermal resistance of the annulus gap between the studs and the housing cylindrical opening wall is lowered.

A further advantage of the host conduction module of the present invention is that the temperature differentials within the circuit chips are diminished by providing additional heat transfer contact points thereon.

Another advantage of the heat conduction module of the present invention is that the thermal conduction arrangement within the module is inexpensive and easy to manufacture.

BRIEF DESCRIPTION OF THE DRAWINGS

Details of my invention will be described in connection with the accompanying drawings:

FIG. 3 is a blown up schematic of a cross-sectional view through a prior art stud in a thermal conduction module;

FIG. 3a is a schematic plan view of a prior art stud in the cylindrical opening of a thermal conduction module;

FIG. 4 is a schematic plan view of a six stud element in a cylindrical opening of a heat conduction module;

FIG. 4a is a blown up schematic diagram of a cross-section of a six stud element taken along the line 4a—4a of FIG. 4;

BEST MODE FOR CARRYING OUT THE INVENTION

Figure 1:
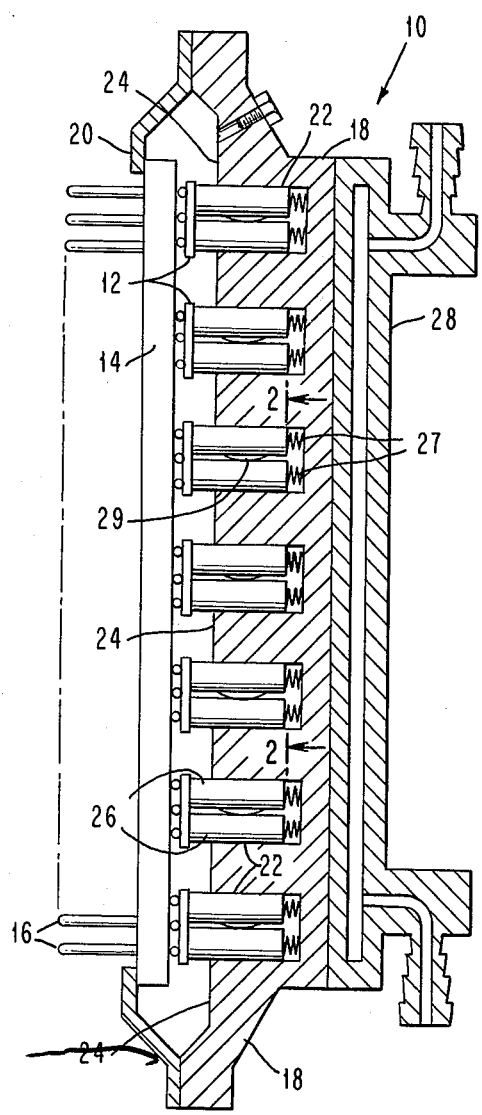
FIG. 1 is a partial cross-sectional view of a heat conduction module showing four stud elements in each cylindrical opening spring loaded against the adjacent chip.

Referring to FIG. 1, there is shown a partial cross-sectional view of a thermal conduction module 10 for providing heat removal from the integrated circuit chips 12 contained therein. As is well known, a chip consists of solid state circuits and devices which are densely packed thereon. The power consumed in the circuits within the chip generates heat, which must be removed from the chip. Since the various circuits have different power requirements, and since the integrated components thereon must be maintained within certain temperature ranges for reliable operation, the heat transfer must be of such character as to maintain the chip temperature within the required operating range.

Figure 2:
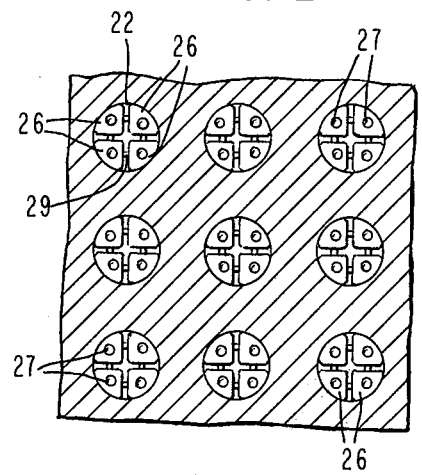
FIG. 2 is a partial section taken along the line 2—2 of FIG. 1 showing that there are four stud elements contacting each chip in a matrix of chips.

The chips 12 are mounted on one side of a substrate 14, generally made of ceramic, which has pins 16 extending from the other side thereof. These connecting pins 16 provide for the plugging of the module into a board (not shown) which may very well carry auxiliary circuits, etc. A housing or cap 18 is attached to the substrate 14 by means of a flange 20, which extends from the periphery of the substrate 14 to the cap 18. The cap 18 is made of a good heat conductive material, such as copper or aluminum. The cap 18 contains a dead ended cylindrical opening 22 adjacent each of the chips 12. These openings 22 extend into the cap 18 from the surface 24 facing the chips 12. FIG. 2 shows a 3×3 matrix of openings 22 containing four heat conductive or stud elements 26 in each opening. These openings 22 have to be of sufficient depth and diameter to receive the required number of stud elements 26. Actually, the stud elements 26 can take various shapes, but the preferred shape is wedge shaped, since this shape maximizes the volume of the cylindrical opening 22 that is filled with the stud elements 26. The stud elements 26 are made of copper or aluminum or an alloy thereof because of their good heat conducting qualities. The number of stud elements 26 in each opening 22 is dependent upon a number of factors such as the amount of power consumed by the chip, the difficulty in manufacturing and assembly, etc. It should be appreciated, that the object is to contact as much of the chip 12 surface as possible with the stud elements 26. Accordingly, if there are a large number of stud elements 26 contacting the surface, the lateral dimension of the stud elements 26 will have to be relatively small to be included in the cylindrical opening 22 in the housing 18 adjacent the chip surface. Similarly, if fewer stud elements 26 are utilized in each cylindrical opening 22, the size can be increased accordingly. Each stud element is individually spring loaded by spring means 27 so as to exert a predetermined force against the chip 12 surface. The springs 27 are compressed against the end wall of the opening and the inner end of each stud 26, thereby providing lengthwise force on the studs urging them lengthwise out of the opening into contact with the adjacent chip. Further spring means 29 in the form of a leaf spring, are located between each of the studs 26 within an opening 22 forcing the studs 26 apart and into good thermal contact with the cylindrical wall of the opening 22.

The thermal conduction module 10 shown in FIG. 1 contains a cold plate 28 attached to the housing 18 which is the ultimate heat sink. The multiple studs 26 are believed to increase the heat transfer from the chips 12 sufficiently, that a finned air cooling heat sink arrangement would be operable therewith. Because of the increased heat removal capabilities, the multiple studs 26 allow the use of a higher power chip 12. The multiple stud arrangement is also readily adaptable to the various known enhancements for improving heat transfer, such as the use of helium, grease, etc. in the gaps.

A prior art arrangement of a single element stud 30 located in a cylindrical opening 32 in a housing 34 and spring loaded against a chip 36 is shown in FIGS. 3 and 3a. The tilt of the chip in FIG. 3 is considerably exaggerated for purposes of illustration. Chips 36 mounted on solder ball connectors 38, as shown in FIG. 3, have a tendency to be slightly tilted as a result of this type of mounting. The prior art one piece stud 30 extending from the cylindrical opening 32 in the housing 34 will contact the chips 36 at the highest point thereof. As can be seen in FIG. 3, this creates a large gap 40 between the stud 30 and the chip 36 which is ordinarily filled with air. Air is a well known good thermal insulator which provides a high thermal resistance in the gap 40 between the chip 36 and the stud 30. A number of solutions have been proposed to solve this problem. For example, the module has been filled with helium gas which fills the gap 40 between the chips and the studs lowering the thermal resistance, since helium gas is a much better heat conductor than air. This solution introduced problems of containing the helium gas for the necessary length of time, since it is a highly permeable fluid. It has also been proposed that the end of the stud contacting the chip be outwardly curved or dished, thereby giving a predetermined area contact between the stud and the chip regardless of the chip tilt. It should be noted that the one piece stud 30 makes contact with the cylindrical walls 42 of the opening 32 in which it is located at one or two places 44 with the rest of the circumference of the stud 30 forming an annular gap 46 with the cylindrical wall 42 of the opening 30. This gap 46 can create a high thermal resistance, thereby, restricting the heat removal ability of the module.

FIGS. 4 and 4a illustrate the features of the present invention which overcome the problems in the prior art, thereby, improving the heat transfer from the module. In FIG. 4a the tilt of the chip 50 is somewhat exaggerated to better illustrate the invention. A plurality of studs 52 are shown located in a cylindrical dead-ended cylindrical opening 54 in the module housing 56. As can be seen in FIG. 4, there are six wedge-shaped studs 52 located in each cylindrical housing opening 54 within the module. The outer periphery of the wedge-shaped stud 52, that is, the surface 58 opposite the pointed end of the wedge is curved with a similar curvature to that of the cylinder wall 60. The six wedge-shaped studs 52 are fitted together, as shown in FIG. 4, and inserted into the cylindrical opening 54 in the module housing 56. As shown in the cross-sectional diagram of FIG. 4a, each stud 52 makes at least a point contact with the chip 50 regardless of the tilt. There are now six areas or points of contact. It can be seen from FIG. 4a that the six points of contact not only improve the thermal conduction from the chip 50, but also reduce the size of the gap 62, thereby, further lowering the thermal resistance of the gap. This arrangement also has the advantage of distributing the points where the thermal conduction is concentrated about the surface of the chip 50. This considerably reduces the temperature differential ($\Delta t$) in the chip, thereby reducing stresses in the chip.

Each of the studs 52 within an individual cylindrical opening 54 are spring loaded outwardly from the cylindrical opening 54 to provide a positive contact with the chip 50. The springs 64 not only hold the studs 52 in place against the adjacent chip surface, but provide a positive force of the stud 52 against the chip 50, which force has been found to enhance the heat transfer from the chip 50 to the stud 52. The spring 64 may be of the coil type, with one end thereof inserted in a cylindrical opening 66 provided in the top of each stud 52. The other end of the spring 64 bears against the inner end of the cylindrical opening 54 in the housing 56, thereby, providing sufficient compression of the spring 64 when the stud 52 is in place to provide the desired outward force on the stud. Since each stud 52 is free to move individually, the individual spring force provides the individual contacting force of each stud 52 against the chip 50.

Figure 5:
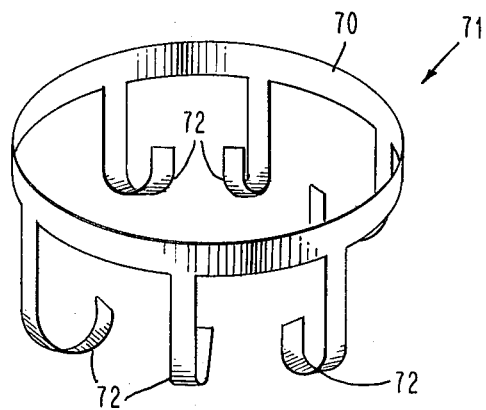
FIG. 5 is a schematic representation of a crown spring with multiple springlets, one for each stud element in a cylindrical opening of a thermal conduction module.

An alternative spring 71 for the individual stud elements is shown in FIG. 5. The arrangement is known as a crown spring 71 which consists of a band 70 with the appropriate number of springlets 72 or curved portions made of spring material, such that the spring material portion bears against the top of one of the studs 52. Thus, the number of studs 52 determines the number of springlets 72. The crown spring 71 is inserted into the cylindrical opening 54 with the band 70 side first so that the springlets 72 extend away from the bottom of the cylindrical opening 54 to provide the required spring force for each stud 52. The main advantage of this type spring lies mainly in the ease of assembly over against the handling of a number of individual springs 64.

Figure 6:
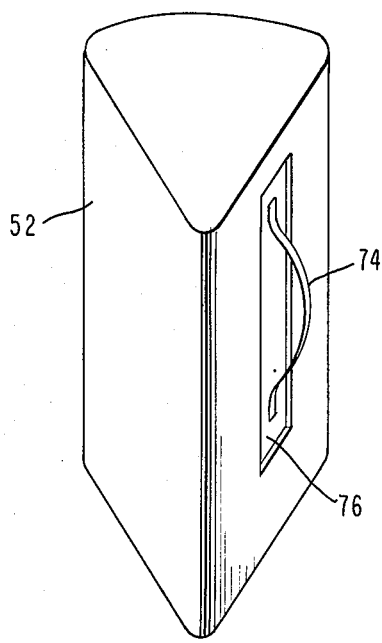
FIG. 6 is a blown up representation of a single stud element showing the side springlet in detail.

A blown up view of one of the studs 52 showing a side mounted leaf spring or springlet 74 is shown in FIG. 6. An indented groove 76 is located lengthwise along one side of the stud. The ends of the springlet 74 are attached to the bottom of the groove 76 at the appropriate distance from one another to provide the required bowing of the springlet. The springlet 74 consists of a strip of spring material of sufficient resiliency to provide a small outward force from the side of the stud 52 from which the springlet extends.

Figure 7:
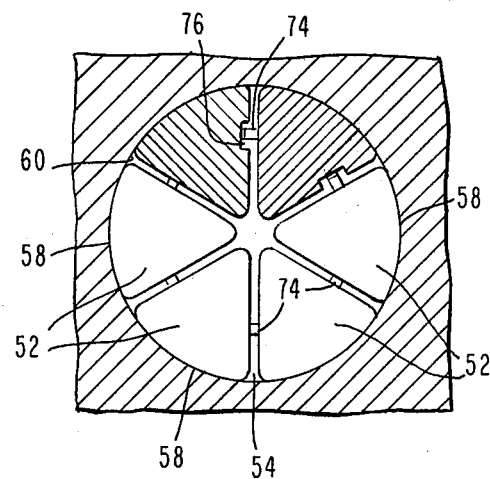
FIG. 7 is a schematic partial cross-sectional plan view of a six stud element showing the operation of the springlet therebetween in detail.

FIG. 7 is a blown up plan view in partial section looking in at one of the ends of the studs 52. Each of the springlets 74 extending from the side of the stud 52, when assembled will provide a force against the adjacent stud, which force causes the outer curved surface 58 of the stud 52 to make good contact with the cylindrical wall 60 of the opening 54 containing the studs. As was mentioned above, contacting force at the contact area between two surfaces, enhances the thermal conductivity thereof. Accordingly, the springlet 74 on the side of each stud 52, when assembled, causes each of the studs 52 to make at least line contact with the cylindrical wall 60 of the opening 54. It should be appreciated that six areas of contact are provided, thereby, considerably reducing the annulus gap as indicated in FIG. 4. This considerably reduces the thermal resistance of the gap or interface between the studs 52 and the cylindrical wall 60 of the housing openings 54. The springlets 74 under severe pressure could fit within the groove 76 in the side wall of the stud 52. However, this kind of pressure is not contemplated. The essentially spring suspension of the studs 52 relative to one another within the cylindrical opening 54 reduces the friction between the stud side walls providing easier lengthwise motion of the individual studs 52 so as to limit the end spring 64 force required to provide the force holding the studs 52 against the chip 50.

As was previously mentioned, various enhancements can be applied to the module 10 such as outwardly curving or dishing the end of the studs which contact the chip, and filling the interfaces between the chip and the studs and the studs and the cylindrical walls of the housing with better heat conducting materials such as helium, dielectric liquid, wax, etc.

While I have illustrated and described a preferred embodiment of my invention, it is to be understood that I do not limit myself to the precise construction herein disclosed and the right is reserved to all changes and modifications coming within the scope of the invention as defined in the appended claims.

Having thus described my invention, what I claim as new, and desire to secure by Letters Patent is:

1. A thermal conduction module for removing heat from one or more chips located therein comprising:
 a housing made of heat conductive material forming a cap over the chips;
 one or more openings in said housing extending perpendicular from the surface facing the chips, one opening opposite each of the chips;
 more than one heat conductive element in each of said openings free to move independently in a lengthwise direction with respect to said heat conductive element within said opening;
 end spring means located in each opening for applying lengthwise force to each of said heat conductive elements so that the end of each heat conductive element opposite said spring end contacts the adjacent chip to lower the thermal resistance of the interface between the chip and the heat conductive element; and
 side spring means located between sides of adjacent heat conductive elements forcing them away from one another and into contact with said opening wall to thereby lower the thermal resistance between said heat conductive elements and the opening walls.

2. A heat conduction module according to claim 1, wherein said one or more openings in said housing are cylindrical and are dead ended within said housing at a predetermined depth.

3. A heat conduction module according to claim 1, wherein each of said heat conductive elements has a curved side wall which makes contact in the lengthwise direction along the opening wall.

4. A heat conduction module according to claim 1, wherein each of said heat conductive elements in each of said openings are wedge shaped with the thicker dimension of each wedge facing the wall of said opening.

5. A heat conduction module according to claim 4, wherein said wedge shaped heat conductive elements have an outer surface at the thicker end thereof which has substantially the same shape as the wall of said openings in said housing.

6. A heat conduction module according to claim 1, wherein said end spring means is located between the inner end of each heat conductive element and the inner end of each opening and consists of individual coil springs each applying an outward force to the associated heat conductive element away from the inner end of said opening.

7. A heat conduction module according to claim 1, wherein said end spring means is a crown spring having a number of springlets extending therefrom, each springlet being in contact with the inner end of a respective heat conductive element.

8. A heat conduction module according to claim 1, wherein said side spring means consists of an outwardly bowed piece of spring material attached at each end thereof to the side of each heat conductive element.

9. A heat conduction module according to claim 1, wherein said side spring means provides a torquing of each heat conductive element so that the outer wall thereof contacts the inner wall of said opening.

* * * * *